(12) United States Patent
MacGugan (10) Patent No.: US 6,918,297 B2
(45) Date of Patent: Jul. 19, 2005

(54) MINIATURE 3-DIMENSIONAL PACKAGE FOR MEMS SENSORS

(75) Inventor: Douglas C. MacGugan, Bellevue, WA (US)

(73) Assignee: Honeywell International, Inc., Morristown, NJ (US)

( * ) Notice: Subject to any disclaimer, the term of this patent is extended or adjusted under 35 U.S.C. 154(b) by 142 days.

(21) Appl. No.: 10/377,439

(22) Filed: Feb. 8, 2003

(65) Prior Publication Data

US 2004/0169244 A1 Sep. 2, 2004

(51) Int. Cl.[7] .................................................. G01P 9/04
(52) U.S. Cl. .............................. 73/504.15; 73/540.12; 257/416; 257/678; 385/17; 385/18; 385/19
(58) Field of Search ......................... 73/504.12, 504.15; 257/416, 678; 385/17, 18, 19

(56) References Cited

U.S. PATENT DOCUMENTS

| | | | |
|---|---|---|---|
| 6,109,105 A | * | 8/2000 | Kubena et al. .......... 73/504.15 |
| 6,577,134 B2 | * | 6/2003 | Farruggia et al. ........... 324/425 |
| 2003/0209789 A1 | * | 11/2003 | Hanson et al. .............. 257/678 |
| 2004/0085159 A1 | * | 5/2004 | Kubena et al. ............. 333/188 |

* cited by examiner

Primary Examiner—David Nelms
Assistant Examiner—Dao H. Nguyen
(74) Attorney, Agent, or Firm—Charles J. Rupnick (57) ABSTRACT

An apparatus for mechanically mounting one or more Micro Electro-Mechanical System (MEMS) sensors on a stable, structurally sound base, the base being a generally cubical block formed in a ceramic substrate having a plurality of substantially planar and mutually orthogonal surfaces, wherein a first one of the surfaces is structured for rotationally interfacing with a host structure that is to be monitored; one or more of the remaining surfaces is structured for mechanically mounting of a MEMS sensor; and a plurality of electrical signal carriers communicate between each of the MEMS sensor mounting surfaces and a plurality of electrical interface contacts positioned on the interfacing surface.

20 Claims, 6 Drawing Sheets

MINIATURE 3-DIMENSIONAL PACKAGE FOR MEMS SENSORS

FIELD OF THE INVENTION

The present invention relates to packaging of sensor devices and methods, and in particular to 3-dimensional structures for packaging of Micro Electro-Mechanical System (MEMS) sensor devices.

BACKGROUND OF THE INVENTION

Micro Electro-Mechanical System (MEMS) inertial sensors, including accelerometers, gyroscopes and magnetometers, are generally well-known and commercially available from Honeywell International, Incorporated, the assignee of the present patent application. These MEMS inertial sensors are typically mounted as individual units directly on the host structure to be monitored. While effective, such direct mounting places increased demands on the precision and accuracy with which the structure to be monitored is manufactured in order to achieve true three-axis orientation. Nor can direct mounting on the host structure obtain the small size advantages offered by the MEMS sensors. Furthermore, assembly and testing of the MEMS sensors requires access to and manipulation of the entire host structure. These limitations in turn limit the performance that can be achieved by the MEMS sensors.

SUMMARY OF THE INVENTION

The present invention is a miniature 3-dimensional packaging structure for mounting one or more Micro Electro-Mechanical System (MEMS) inertial sensors that captures the small size advantage of MEMS sensors and overcomes limitations of the prior art by providing a stable, structurally sound base for mechanically mounting the MEMS sensors. The package provides a means for transferring electrical power and operating signals to and from the MEMS sensors. The package also provides means for insuring maximum performance is obtained over dynamic environments observed by the MEMS inertial sensors.

The 3-dimension package structure of the invention accepts one, two or three MEMS inertial sensors in close-proximity orthogonal positions. The structural ceramic package provides mounting for each axis of a three-axis MEMS inertial sensor triad on orthogonal sides of a generally cubical package that provides a structurally sound base for rugged mounting of the MEMS inertial sensors. These MEMS sensors are alternatively separately packaged in chip carrier devices, such as a ceramic 20-pin leaded chip carrier (LCC), and are attached to the 3-dimension package structure of the invention. According to one embodiment of the invention, the 3-dimension package structure of the invention provides direct mounting of the MEMS sensors by conventional die bonding techniques.

Accordingly, one embodiment of the invention provides an apparatus for mechanically mounting one or more MEMS sensors on a stable, structurally sound base, the base being a generally cubical block formed in a substrate having a plurality of substantially planar and mutually orthogonal surfaces, wherein a first one of the surfaces is structured for rotationally interfacing with a host structure that is to be monitored; a second one of the surfaces is structured for mechanically mounting of a MEMS sensor; and a plurality of electrical signal carriers communicate between the MEMS sensor mounting surface and a plurality of electrical interface contacts positioned on the interfacing surface.

According to one aspect of the invention, the substrate is a ceramic substrate.

According to another aspect of the invention, the first surface structured for rotationally interfacing with a host structure includes a structural key oriented diagonally to the surface.

According to another aspect of the invention, the generally cubical block includes a generally cylindrical aperture communicating between the interfacing surface and a surface of the block opposite thereto.

According to another aspect of the invention, the generally cubical block further includes multiple surfaces structured for mechanically mounting of a MEMS sensor; a quantity of the electrical signal carriers communicate between each of the MEMS sensor mounting surfaces and corresponding electrical interface contacts positioned on the interfacing surface; and a MEMS sensor is mounted to each of the MEMS sensor mounting surfaces and is electrically interfaced to the electrical signal carriers.

According to another aspect of the invention, each of the MEMS sensors is a MEMS sensor packaged in a hermetically sealed LCC.

According to another aspect of the invention, each of the plurality of surfaces structured for mechanically mounting of a MEMS sensor includes a recessed cavity formed in and peripherally surrounded by a surface of the block, and a cover is installed over each MEMS sensor and sealed to the surface of the block. According to another aspect of the invention, the seals between each of the covers and the block is a hermetic seal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for mechanically mounting one or more Micro Electro-Mechanical System (MEMS) sensors on a stable, structurally sound base that is formed of a miniature generally cubical ceramic block having two or more substantially orthogonal surfaces. One of the two orthogonal surfaces is structured for mechanically mounting of a single MEMS sensors. Means are provided for routing power, ground and signals between each of the one or more MEMS sensors and a common surface of the mounting block for interface with external circuitry. One of the orthogonal surfaces, for example the common surface hosting the external circuitry interface, includes a structural key for rotationally interfacing with an external key mechanism in the host structure to be monitored. Means are provided for mechanically securing to the host structure. Additionally, means may be provided for hermetically sealing each of the one or more MEMS sensor devices.

Figure 1:
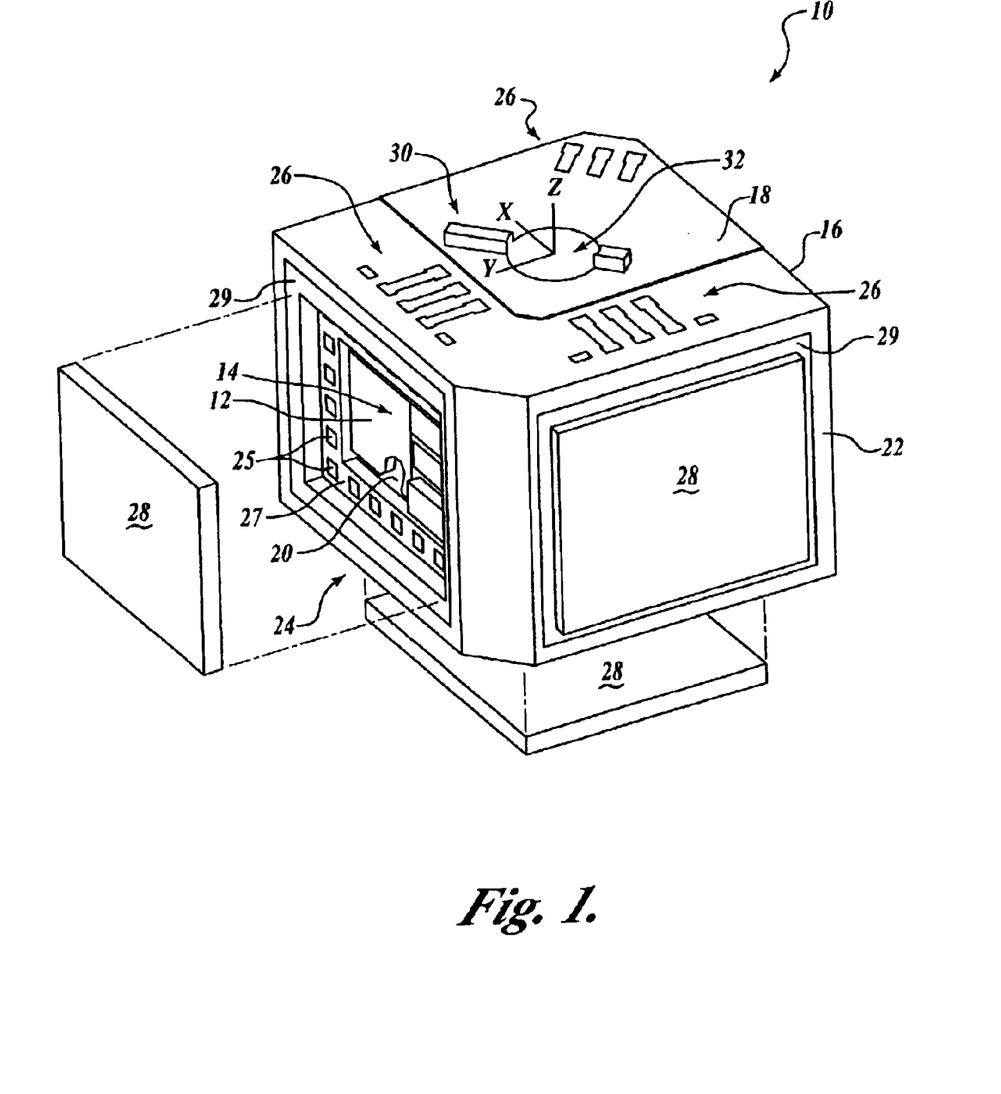
FIG. 1 is an exploded pictorial view of a 3-axis MEMS inertial sensor device mounted on the stable, structurally-sound mechanical mounting base of the invention embodied as a generally cubical 3-dimensional package that provides for mounting on orthogonal sides thereof each axis of a 3-axis MEMS inertial sensor wherein the MEMS sensors are hermetically sealed with individual covers.

FIG. 1 is an exploded pictorial view of a 3-axis or "triaxial" MEMS inertial sensor device having individual MEMS inertial sensors mounted on the 3-dimensional package of the invention embodied as a stable, structurally-sound generally cubical mechanical mounting base. Accordingly, a 3-axis MEMS inertial sensor device 10 is provided having three MEMS inertial sensors 12 and complementary electronic circuits 14 (200 MOhm major signal conditioning resistors shown) mounted on the 3-dimensional package 16 of the invention.

As is more fully discussed below, the 3-dimensional package 16 of the invention is embodied as a miniature generally cubical block having a package interface surface 18 and one or more MEMS sensor mounting surfaces 20, 22, 24. Each of the sensor mounting surfaces 20, 22 is structured mutually orthogonal to and contiguous with the package interface surface 18, and the sensor mounting surface 24 is structured mutually parallel to and spaced away from the package interface surface 18. One, two or three of the MEMS sensors 12 are mounted directly to the 3-dimensional package 16 of the invention using well-known conventional die-bonding techniques suited for MEMS sensors.

Signal and power routing to the MEMS sensors 12 is accomplished via conventional wire bonding techniques, ribbon welding, or flip-chip attach methods. According to one embodiment of the invention, the device package 16 further provides integral metalization of signal and power traces to electrical bonding pads for direct bonding of the MEMS inertial sensor triad device 10 to a next level assembly with the host structure.

The device package 16 is further embodied having means for routing electrical power, ground and operational signals between the orthogonal and parallel sensor mounting surfaces 20, 22, 24 and the common interface surface 18, as illustrated, or another suitable surface. For example, a quantity of die bond pads 25 are provided on a die bond shelf 27 structured above and surrounding each MEMS sensor mounting surfaces 20, 22, 24. A quantity of electrical traces (more clearly shown in subsequent Figures) are routed over the surfaces 18, 20, 22, 24 or through the body of the package 16 to a quantity of electrical interface contacts, or "pad outs," 26 that may be grouped, as illustrated, as a function the sensor mounting surface 20, 22, 24 with which the electrical contacts 26 communicate.

Each of the sensor mounting surfaces 20, 22, 24 is optionally structured as the floor of a recess or cavity in the body of the package 16, as illustrated, wherein the MEMS inertial sensors 12 and complementary electronic circuits 14 are mounted. Accordingly, individual covers or lids 28 may be provided over the sensors 12 and circuits 14 and bonded, adhesively or otherwise, to the outer surfaces of the package body 16. The covers 28 thereby protect the sensitive components. Furthermore, according to one alternative embodiment of the invention, the mounting area of the MEMS sensors 12 includes provision for hermetically sealing the devices within the 3-dimensionally-structured sensor mounting cavities 20, 22, 24. For example, a portion 29 of the outer surfaces of the package body 16 surrounding each of the sensor mounting surfaces 20, 22, 24 is prepared by conventional means for hermetically sealing for attaching and hermetically sealing the covers 28. Hermetic sealing of the sensors 12 is provided using solder or laser attachment of metalized lids 28, or hermetic epoxy sealing of the lids 28, to the prepared surfaces 29.

The package interface surface 18 is structured for mechanically mounting the package 16 to a host structure (not shown) that is to be monitored. According to one embodiment of the invention, the package interface surface 18 includes a structural key 30 for interfacing with a cooperating key mechanism provided on the host structure for rotationally orienting the device package 16 relative to the host structure.

Once the MEMS sensors 12 are attached to the 3-D structure of the package 16, the invention provides the unique miniature MEMS inertial triad 10 of orthogoanally mounted sensors. This embodiment, and alternative embodiments discussed herein, permits the MEMS inertial triad 10 to be manually manipulated for calibration and test, or for attachment to the host structure for calibration and test at the next level of assembly.

The package 16 is alternatively embodied having means for mechanically securing it to the host structure. For example, according to one embodiment of the invention, when the MEMS inertial sensor device 10 of the invention is embodied as a two-axis or "biaxial" MEMS inertial sensor having the MEMS sensors 12 mounted on the two sensor mounting surfaces 20, 22 orthogonal to and contiguous with the package interface surface 18, a bolt hole 32 through the body of the package 16, or another suitable mechanical securing means, is provided for mechanical securing the package 16 to the host structure.

Figure 2:
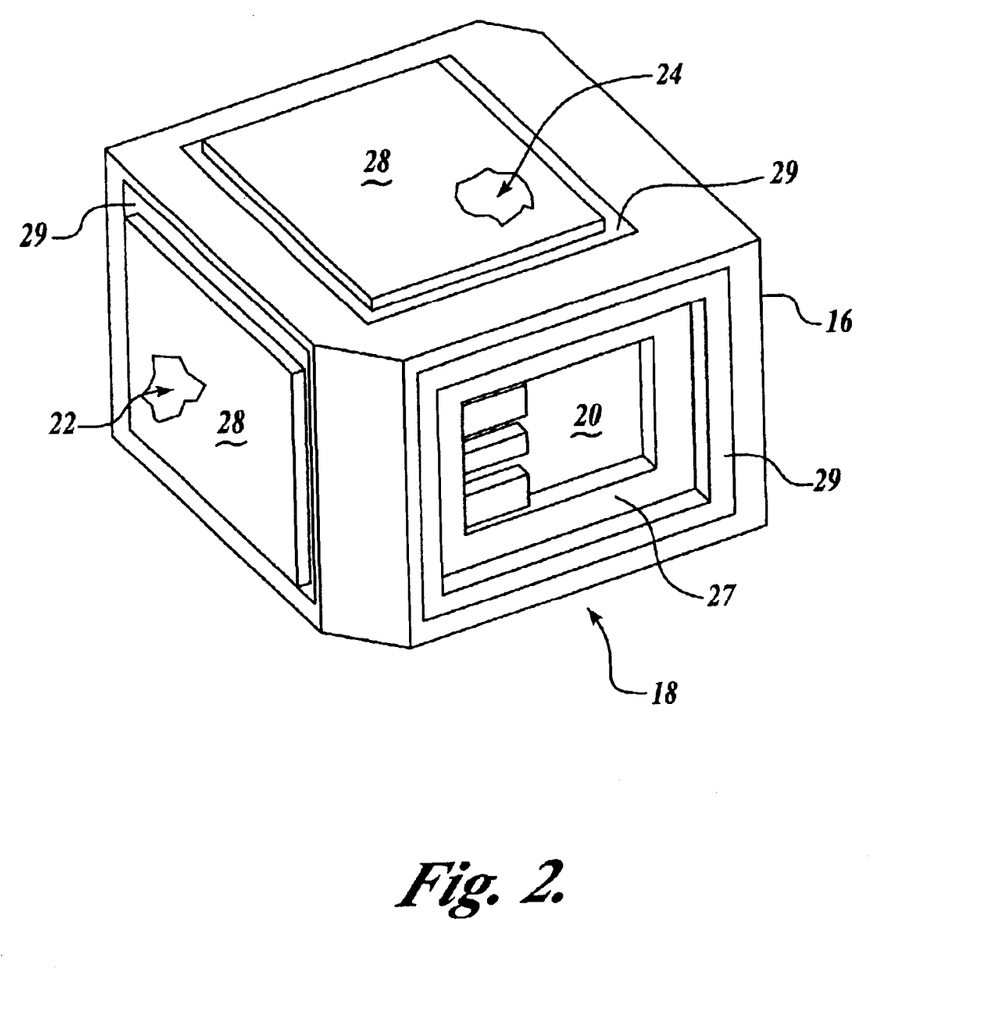
FIG. 2 shows the triaxial MEMS inertial sensor device rotated with the three device mounting surfaces shown, two of the sensors being protected by hermetically sealed covers and the third sensor being removed so that the device mounting surface is shown.

FIG. 2 shows the triaxial MEMS inertial sensor device 10 rotated so that the three sensor mounting surfaces 20, 22, 24 are observed. Two of the sensors 12 being protected by hermetically sealed covers 28, and the third sensor 12 being removed so that sensor mounting surface 20 is visible.

Figure 3:
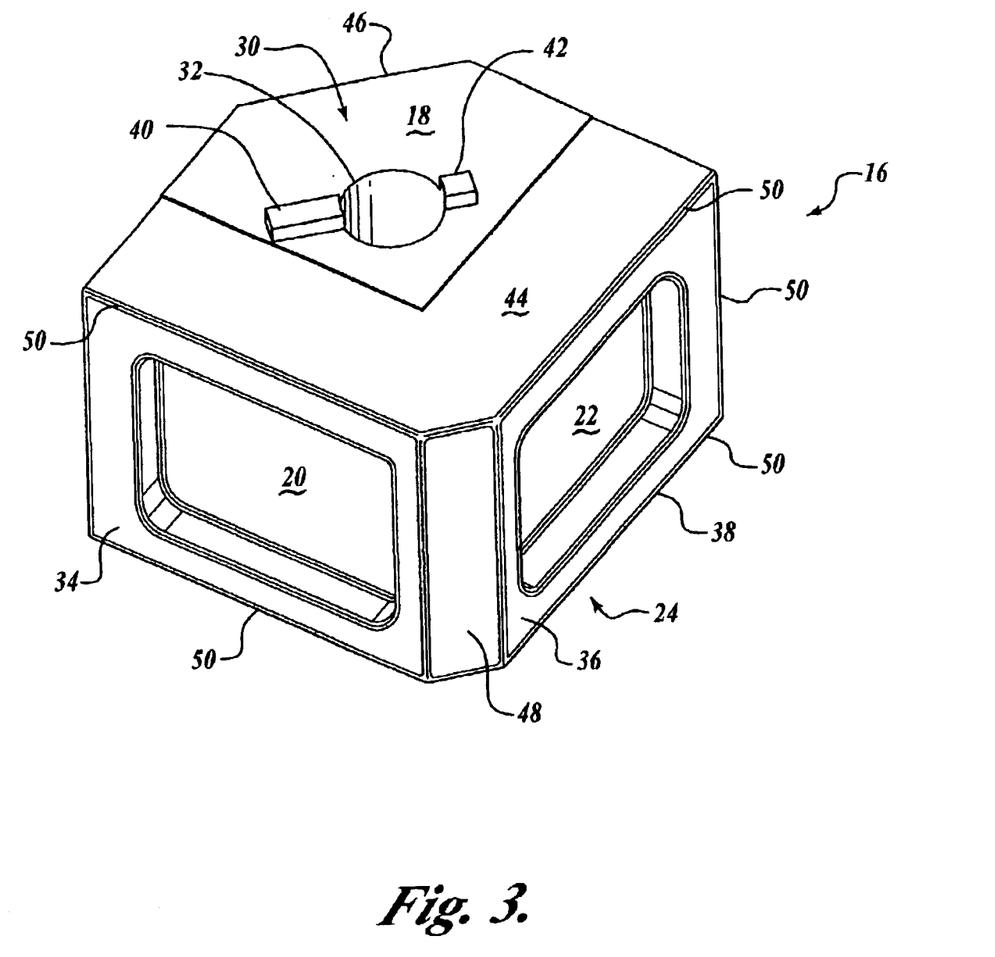
FIG. 3 illustrates the mechanical mounting base of the invention embodied as a structurally sound generally cubical 3-dimensional package structure formed in a ceramic substrate that is thermally matched to the substrates in which the MEMS inertial sensors are fabricated.

FIG. 3 illustrates the mechanical mounting base of the invention embodied as the generally cubical 3-dimensional package 16 structure formed in a ceramic substrate. The choice of ceramic ensures that the package 16 is structurally sound and is closely thermally matched to the substrate material on which the MEMS sensors 12 are fabricated. For example, the ceramic substrate in which the package 16 is formed in an alumina ceramic substrate for optimum matching of coefficients of thermal expansion. The ceramic package 16 is configured using conventional ceramic fabrication techniques. For example, the 3-dimensional package 16 is machined from a solid ceramic such as MACOR® a machinable ceramic commercially available from Corning Incorporated. Alternatively, the 3-dimensional package 16 is molded of a moldable ceramic, or built-up using conventional HTCC (high temperature ceramic co-firing) or LTCC (low temperature ceramic co-firing) techniques. The fabrication technique is selected as a function of specifics of the package design and particular embodiment, which are determined as a function of the MEMS sensors incorporated in the device 10. LTCC and HTCC co-fired techniques permit metallization of the electrical power and signal traces during fabrication. Alternatively, metallization of the electrical power and signal traces can be implemented using thin film deposition or thick film printing techniques.

The ceramic package 16 is fabricated having the plurality of substantially mutually orthogonal and parallel surfaces 18, 20, 22, 24, the surfaces 20, 22, 24 each being large enough and appropriately structured for mechanically mounting a single MEMS sensor 12 and, optionally, the related electronic circuits 14. According to one embodiment of the invention, the ceramic package 16 is provided with cover mounting surfaces 34, 36, 38 completely surrounding and spaced above the recessed sensor mounting surfaces 20, 22, 24. The MEMS sensor surfaces 20, 22, 24 are spaced sufficiently below the respective surrounding surfaces 34, 36, 38 to permit the covers 28 to be engaged with the respective cover mounting surfaces 34, 36, 38 without interfering with the MEMS sensors 12 or electronic circuits 14. The cover mounting surfaces are sufficiently planar to permit hermetic sealing of the covers 28 and are prepared by conventional means for hermetic sealing of the covers 28, as discussed herein.

According to one embodiment of the invention, the ceramic package 16 incorporates structural features for keying the MEMS sensor triad 10 in alignment and rotational orientation with the host structure both for optimizing performance and for easing assembly. For example, the package interface surface 18 includes the structural key 30 for embodied by example and without limitation as one or more substantially rectangular blocks 40, 42 having a combined length structured to ensure adequate rotational orientation relative to the host structure when mated with a cooperating keyway therein. Furthermore, the structural key 30 is oriented relative to the MEMS sensor mounting surfaces 20, 22 orthogonal to the package interface surface 18 to optimize orientation to the host structure. For example, the structural key 30 is rotated diagonally to the interface surface 18, i.e., at about 45 degrees from each of the orthogonal sensor mounting surfaces 20, 22.

The package interface surface 18 is optionally embodied as an offset surface relative to a relieved surface portion 44 whereupon the electrical interface contacts 26 may be provided, as discussed below. Interference with a flush surface-to-surface interface is thereby avoided.

The means for mechanically securing the ceramic package 16 to the host structure, such as bolt hole 32 or another suitable mechanical securing means, is provided in balanced alignment with the cubical ceramic package 16. For example, the mechanical securing means embodied as bolt hole 32 passes through the geometric center of the cubic structure between the package interface surface 18 and the opposite package surface 24. Such alignment tends to stabilize the ceramic package 16 relative to the host structure when secured by a fastener (not shown) through the bolt hole 32 into a threaded receiver in the mating surface of the host structure.

According to one embodiment of the invention, unused volume of the ceramic package 16 is eliminated by beveled corners 46, 48 that also assist with mounting on the host structure by providing clearances for machined surfaces such as internal radii. Beveled corners 46, 48 may also provide clearance for a wiring harness within the host structure. Other edge surfaces 50 of the cubical ceramic package 16 are also beveled or otherwise relieved to accommodate internal radii that may be present in the host structure due to the inherent limitations of machining and other manufacturing processes.

Figure 4:
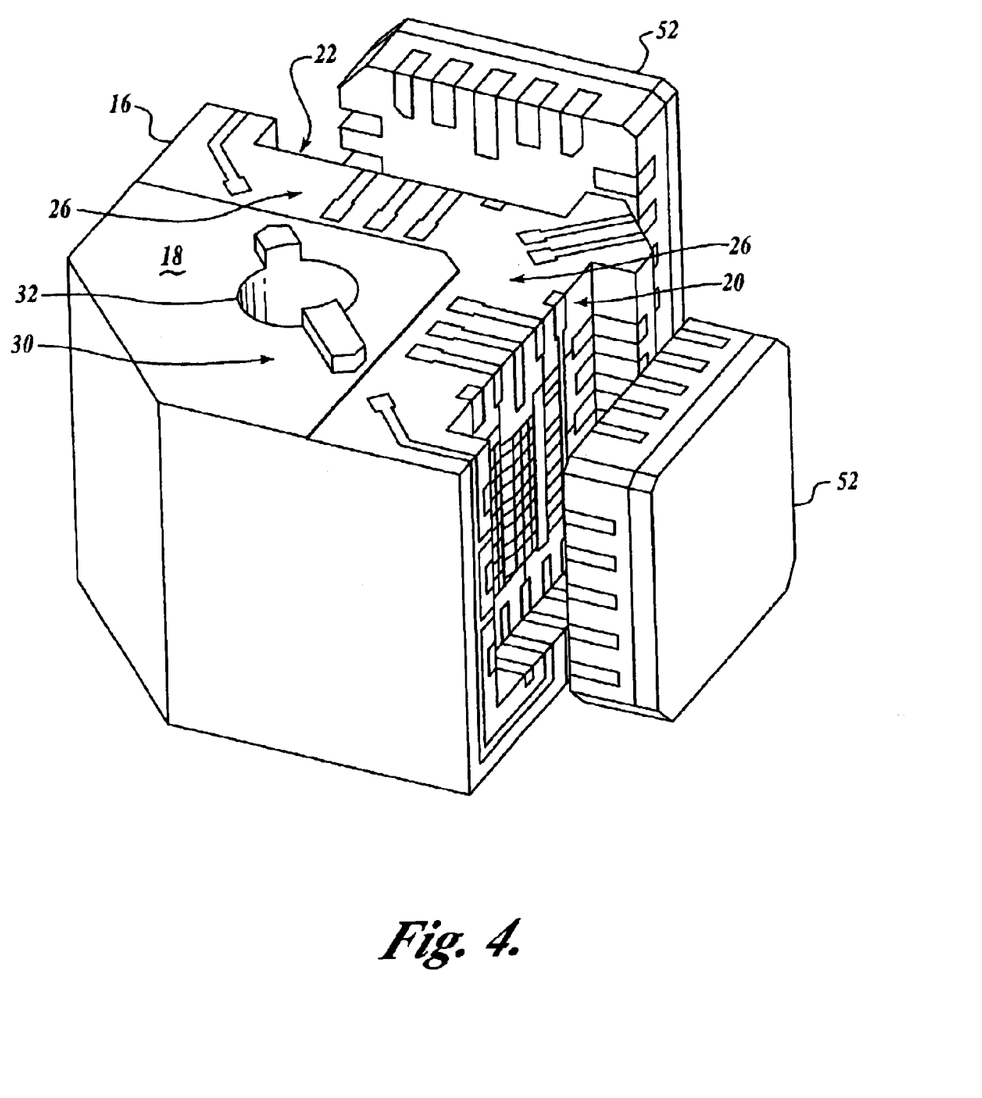
FIG. 4 illustrates the MEMS inertial sensor device of the invention embodied as an alternative biaxial or two-axis sensor device having individually hermetically packaged MEMS sensors.

FIG. 4 illustrates the MEMS inertial sensor device 10 of the invention embodied as an alternative biaxial to or two-axis sensor device having individually hermetically packaged MEMS inertial sensors 52. Accordingly, the cubical ceramic package 16 of the invention is alternatively embodied to include provisions for mounting the individually hermetically packaged MEMS sensors 52 onto its 3-D structure. The MEMS devices 52 are for example individually hermetically packaged in ceramic chip carriers of an appropriate configuration. According to one embodiment of the invention, the MEMS devices 52 are configured in a well-known 20-pin LCC (leaded chip carrier). The embodiment illustrated in FIG. 4 accordingly permits "known good die" (KGD) to be mounted to the ceramic package 16. This embodiment also permits the MEMS sensors 52 to be reworked as individual entities. In operation, KGD are tested or calibrated prior to installation onto the 3-D ceramic package 16. Signal and power routing are incorporated into these alternative embodiments.

The sensor mounting surfaces 20, 22 orthogonal to and contiguous with the interface surface 18 are structured to accommodate the LCC packages containing the MEMS devices. For example, the recessed sensor mounting surfaces 20, 22 are open to the common interface surface 18 to accommodate the LCC packages. Because the LCC packages are individually hermetically sealed, accommodations need not be made for attaching and hermetically sealing independent device covers 28, as described in FIGS. 1 and 2. Electrical power, ground and operational signal lines are brought to the interface contacts 26 over external surfaces of the package 16, as illustrated.

Figure 5:
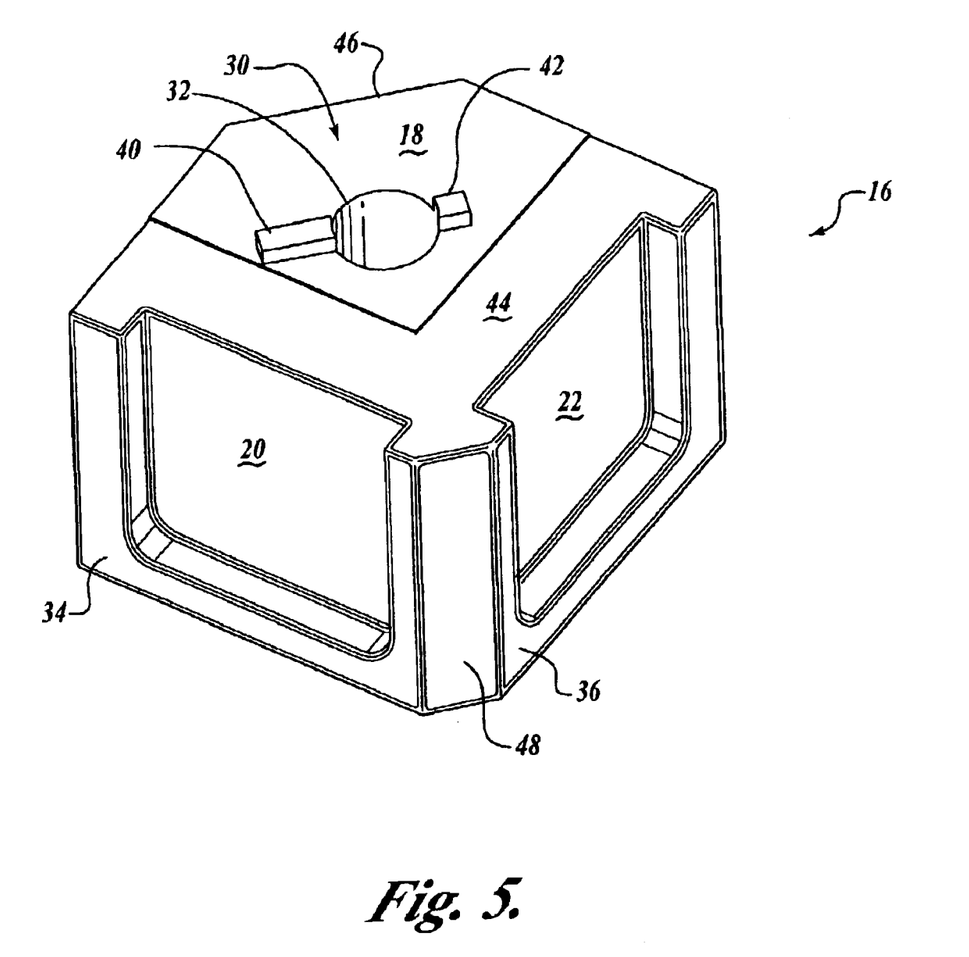
FIG. 5 illustrates the cubical ceramic package of the invention embodied to accommodate the MEMS sensors embodied in LCC packages, as shown in FIG. 4.

FIG. 5 illustrates the cubical ceramic package 16 of the invention embodied to accommodate the MEMS sensors 52 embodied in LCC packages, as shown in FIG. 4. Accordingly, as embodied in FIG. 5, the recessed sensor mounting surfaces 20, 22 are open on the edge contiguous with the relieved portion 44 of the package interface surface 18. The package 16 thereby accommodates the external routing of the electrical power, ground and signal lines without interference.

Figure 6:
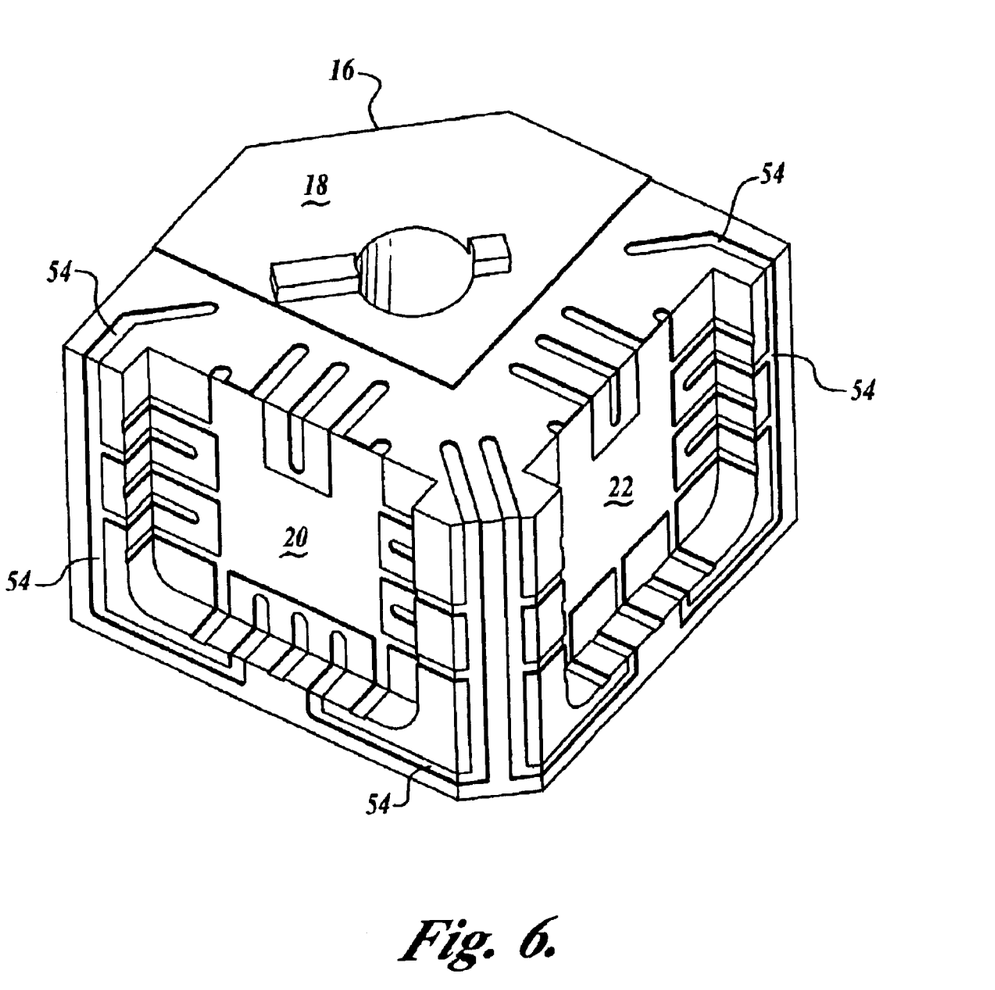
FIG. 6 illustrates an alternative embodiment of the 3-dimensional package shown in FIG. 5 wherein one or more recesses are provided in the relevant surfaces of the package for routing the electrical lines below the surface of the package body, as shown in FIG. 4.

FIG. 6 illustrates an alternative embodiment of the 3-dimensional package 16 shown in FIG. 5 wherein a quantity of recesses 54 are provided in the relevant surfaces of the package 16 for routing the electrical lines below the package body surface, as shown in FIG. 4. The electrical lines are thereby protected from damage that might otherwise interrupt communications with the assembled MEMS devices 52.

While the preferred embodiment of the invention has been illustrated and described, it will be appreciated that various changes can be made therein without departing from the spirit and scope of the invention.

What is claimed is:

1. An apparatus for mounting one or more Micro Electro-Mechanical System (MEMS) sensors, the apparatus comprising:
   means for orthogonally orienting each of at least two different MEMS sensor mounting surfaces relative to a common interface surface, the common interface surface being formed on a unitary generally cubical block and the mounting surfaces being recessed within different external surface of the block;

means for routing electrical power, ground and operational signals between each sensor mounting surfaces and the common interface surface; and means for rotationally interfacing the common interface surface with an external key mechanism.

2. The mounting apparatus of claim 1, further comprising means for mechanically securing the common interface surface to a host structure that is to be monitored.

3. The mounting apparatus of claim 1, further comprising a MEMS sensor mounted on each of the sensor mounting surfaces, each of the MEMS sensors being electrically coupled to the means for routing electrical power, ground and operational signals.

4. The mounting apparatus of claim 3, further comprising means for hermetically sealing one or more of the MEMS sensors within the block.

5. The mounting apparatus of claim 1 wherein the means for orthogonally orienting each of at least two different MEMS sensor mounting surfaces relative to a common interface surface further comprises means for orienting each of at least three MEMS sensor mounting surfaces relative to the common interface surface.

6. The mounting apparatus of claim 5, further comprising means for hermetically sealing each of the MEMS sensors within the block.

7. An apparatus for mechanically mounting one or more Micro Electro-Mechanical System (MEMS) sensors on a stable, structurally sound base, the base comprising:

a generally cubical block formed in a substrate having a plurality of substantially planar and mutually orthogonal surfaces;

a first one of the surfaces being structured for rotationally interfacing with a host structure that is to be monitored;

a plurality of the surfaces orthogonal to the interfacing surface each being formed with a recessed cavity having a sensor mounting surface formed therein, each of the recessed sensor mounting surfaces being structured for mechanically mounting of a MEMS sensor; and a plurality of electrical signal carriers communicating between the each of the MEMS sensor mounting surfaces and a plurality of electrical interface contacts positioned on the interfacing surface.

8. The apparatus of claim 7 wherein the generally cubical block further comprises a ceramic block.

9. The apparatus of claim 7 wherein the first surface structured for rotationally interfacing with a host structure further comprises a structural key oriented diagonally to the surface.

10. The apparatus of claim 7 wherein the generally cubical block further comprises a generally cylindrical aperture communicating between the interfacing surface and a surface of the block opposite thereto.

11. The apparatus of claim 7, further comprising a MEMS sensor being mounted to each of the MEMS sensor mounting surfaces and electrically interfaced to the electrical signal carriers.

12. The apparatus of claim 11 wherein each of the MEMS sensors further comprises a MEMS sensor packaged in a hermetically sealed leaded chip carrier (LCC).

13. The apparatus of claim 11, further comprising a cover installed over each MEMS sensor and sealed to the surface of the block.

14. The apparatus of claim 13 wherein the seals between each of the covers and the block further comprises a hermetic seal.

15. A mounting apparatus for one or more Micro Electro-Mechanical System (MEMS) sensors, the apparatus comprising:

a generally cubical ceramic block having at least four mutually substantially orthogonal surfaces;

structure being formed in a first of the surfaces for mechanically interfacing with a host structure that is to be monitored;

structure being formed in each of a second, a third and a fourth of the surfaces for mounting a MEMS sensor within each of the respective second, third and fourth surfaces;

a structural key being formed in the first surface for rotationally interfacing with an external key mechanism; and a plurality of electrical signal carriers communicating between the mounting structure in each of the second and third surfaces and a plurality of electrical interface contacts positioned on the first surface.

16. The mounting apparatus of claim 15, further comprising a cover hermetically sealed to the ceramic block and enclosing the MEMS sensor mounting structure in each of the respective second, third and fourth surfaces.

17. The mounting apparatus of claim 16 further comprising a single MEMS sensor mounted on each of the MEMS sensor mounting surfaces and electrically interfaced with the electrical signal carriers.

18. The mounting apparatus of claim 15 wherein the structure formed in the first one of the surfaces for mechanically mounting of a MEMS sensor further comprises a surface recessed in a face of the cubical block.

19. The mounting apparatus of claim 18 wherein the recessed surface further comprises a MEMS sensor mounting surface communicating with the interfacing surface along one mutually contiguous border.

20. The mounting apparatus of claim 15, further comprising structure for mechanically securing the ceramic block to the host structure.

\* \* \* \* \*